(12) United States Patent
Bergstedt et al.

(10) Patent No.: US 6,459,585 B1
(45) Date of Patent: Oct. 1, 2002

(54) METHOD OF PRODUCING PRINTED CIRCUIT BOARDS AND A HEAT SINK ARRANGEMENT PRODUCED IN ACCORDANCE WITH THE METHOD

(75) Inventors: Leif Bergstedt, Sjömarken (SE); Per Ligander, Göteborg (SE)

(73) Assignee: Telefonaktiebolaget LM Ericsson (SE)

( * ) Notice: Subject to any disclaimer, the term of this patent is extended or adjusted under 35 U.S.C. 154(b) by 0 days.

(21) Appl. No.: 09/520,840

(22) Filed: Mar. 8, 2000

(30) Foreign Application Priority Data

Mar. 9, 1999 (SE) ................................ 9900840

(51) Int. Cl.[7] .............................. H05K 7/20
(52) U.S. Cl. ................. 361/719; 361/702; 361/704; 174/15.1; 165/80.3
(58) Field of Search ............... 361/687, 702–712, 361/714–722, 732–736, 784, 689–690, 698; 257/706–727, 783; 174/15.1, 16.3, 252; 165/80.2, 80.3, 80.4, 165, 185

(56) References Cited

U.S. PATENT DOCUMENTS

| | | | |
|---|---|---|---|
| 4,387,413 A | | 6/1983 | Griffis |
| 4,509,096 A | | 4/1985 | Baldwin et al. |
| 4,577,402 A | * | 3/1986 | Swanstrom ............... 29/840 |
| 4,628,407 A | * | 12/1986 | August et al. ............. 361/388 |
| 4,908,933 A | | 3/1990 | Sagisaka et al. |
| 5,285,352 A | * | 2/1994 | Pastore et al. ............. 361/707 |
| 5,311,407 A | | 5/1994 | Lumbard |
| 5,590,462 A | | 1/1997 | Hundt et al. |
| 5,779,134 A | | 7/1998 | Watson et al. |
| 5,920,458 A | * | 7/1999 | Azar ....................... 361/704 |

FOREIGN PATENT DOCUMENTS

| | | |
|---|---|---|
| CA | 1153476 | 9/1983 |
| JP | 5-326761 | 12/1993 |

OTHER PUBLICATIONS

International Search Report Date of Completion: Jul. 11, 2000; Date of Mailing: Jul. 13, 2000.

* cited by examiner

Primary Examiner—Gerald Tolin
Assistant Examiner—Michael Datskovsky

(57) ABSTRACT

A component (16) mounted on the board (20) is cooled by a cooling surface (15) in contact with a heat sink element in the form of a metal stud (8) which, in turn, may be connected to an outer cooling surface. One method of achieving this is to form holes (4) in a laminate (1), etching patterns (5), placing a metal stud (8) in the hole (4), applying a dielectric (9) to the upper and lower side of the laminate (1), forming openings (14) in the dielectric (9), and thereafter metal plating the entire circuit board and etching further patterns. Component 16 can then be mounted on the printed circuit board (20). A heat sink element (8) includes a cutting edge (18) and can be used beneficially in conjunction with one embodiment of the method.

12 Claims, 6 Drawing Sheets

METHOD OF PRODUCING PRINTED CIRCUIT BOARDS AND A HEAT SINK ARRANGEMENT PRODUCED IN ACCORDANCE WITH THE METHOD

This application claims priority under 35 U.S.C. §§119 and/or 365 to 9900840-1 filed in Sweden on Mar. 9, 1999; the entire content of which is hereby incorporated by reference.

FIELD OF INVENTION

The present invention relates to the field of printed circuit boards. More specifically, the invention relates to the field of conducting heat from circuit board mounted components.

DESCRIPTION OF THE BACKGROUND ART

Electronic components generate heat when in operation. Some of this heat is normally dissipated to the surroundings. The amount of heat dissipated to the surroundings will depend on the temperature difference between components and their surroundings, the material from which the components are made, and by the ability of the surroundings to absorb heat. The larger the temperature difference, the quicker heat is dissipated; and the more the material from which the component is made dissipates heat, the more heat that will be dissipated. Compare, for instance, a thermos flask with a metal coffee pot. The heat absorbing capacity of the surroundings also plays a part, which is why water can be felt to be colder (or hotter) than air at the same temperature.

Heat that is not emitted to the surroundings will heat the individual components. Although this may sometimes be desirable, it creates a problem in many cases since the component can become too hot and therewith damage itself. In these cases the component will preferably be protected by ensuring that it dissipates more heat, by increasing its heat dissipating properties, by lowering the ambient temperature, or by increasing the heat absorption capacity of the surroundings.

The heat dissipating properties of a component may, of course, often be determined when producing the component oneself or when placing a special order for the component concerned. However, the component used is normally a ready-made component, meaning that it is difficult or impossible to influence the design of the component.

The amount of heat emitted by a component will increase when the temperature of the surroundings is lowered. This can be achieved in several ways, for instance with the aid of cooling fins, fans, heat exchangers, self-convection with air, immersing the component in liquid nitrogen, and so on. The use of liquid nitrogen is a very complicated and expensive procedure, and hence simpler devices are preferred, such as cooling fins and fans, albeit the use of fans or blowers may be impossible in many instances. Although cooling fins and fans (blowers) function effectively with respect to individual components, it may be difficult for such cooling devices to fulfill their function when the component is surrounded by several other components, for instance on a printed circuit board. The closer together the components are, the more difficult it is to cool said components since they heat-up the surroundings of each other.

The trend within the electronic industry is towards smaller equipment, and consequently printed circuit boards have also become smaller. The components on a small printed circuit board are closer together than on a large board. One way of partially avoiding components from heating each other's surroundings is to place high heat-dissipating components far away from each other. This solution, however, can result in a highly complicated circuit board pattern, i.e. the pattern of conductors that electrically interconnect the components.

However, miniaturisation will result sooner or later in components being placed so close together that they indirectly heat-up each other, despite efforts to keep the temperature down. This problem can be solved by applying the third method, in which the heat absorbing capacity of the surroundings is increased. This can be achieved by placing the component in contact with a metal heat sink. Since many metals are effective heat sinks, call to mind a frying pan in this respect, the heat sink is able to carry away heat more effectively than air. The distal end of the heat sink may, in turn, be connected to a cooling fin. The large surface area of the cooling fin is able to cool the component effectively and indirectly. This allows components that have a large heat loss to be placed close to other components on a printed circuit board without heating these other components or the surroundings excessively.

U.S. Pat. No. 5,779,134A teaches a method of mounting heat sink elements on a printed circuit board. In brief, the method involves the steps of covering a number of holes with solder paste, pressing heat sink elements down into the holes and heating the solder paste such as to affix the elements in the holes. One drawback with this method resides in the soldering step, a step which the inventive method avoids. The quality of the solder bond is liable to be impaired by subsequent soldering processes carried out in its proximity, particularly when a component is soldered to the heat sink element.

SUMMARY OF THE INVENTION

The present invention addresses the problem of enabling components to be mounted more densely on a circuit board than was earlier possible without the heat losses of said components causing the circuit board or its peripheral components to be heated to any great extent.

Accordingly, an object of the present invention is to provide a circuit board manufacturing method which has a heat sink facility that enables components to be placed more densely than is safely possible on other printed circuit boards.

Another object of the present invention is to provide an arrangement which provides a heat sink facility that enables components to be placed more densely than on other printed circuit boards.

In brief, the present invention relates to a method and to an arrangement for providing a printed circuit board that has an appearance which enables a heat sink element to be provided for carrying heat away from a component, said element being firmly held by the circuit board and having effective heat conducting contact with the component concerned. The heat sink element may be in contact with an external cooling surface.

The inventive method has the characteristic features set forth in the accompanying claim 1.

Advantageous embodiments of the inventive method will be apparent from the accompanying claims 2–9.

Characteristic features of the inventive arrangement are set forth in the accompanying claim 10.

Advantageous embodiments of the inventive arrangement will be apparent from the accompanying claims 11–12.

Rapid local heat conduction is achieved with heat sink elements, therewith enabling components to be mounted on the surface of a printed circuit board without needing to pay particular respect to the heat losses of said components. As a result, effective earth contact is also obtained between the underside of the components and the earth plane. In one embodiment of the inventive method, the earth plane in the inner layer of the laminate is also connected electrically to the metal stud. This can be achieved at low cost, without needing to introduce new processes in circuit board manufacture.

The invention will now be described in more detail with reference to preferred embodiments thereof and also with reference to the accompanying drawings.

DESCRIPTION OF PREFERRED EMBODIMENTS

Figure 1:
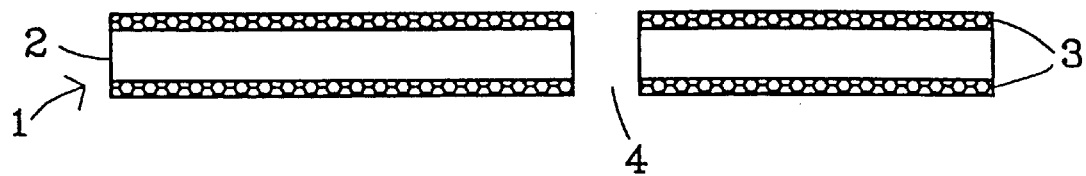
FIGS. 1–8 are cross-sectional views showing the result of certain steps taken in one embodiment of the inventive method.
Figure 2:
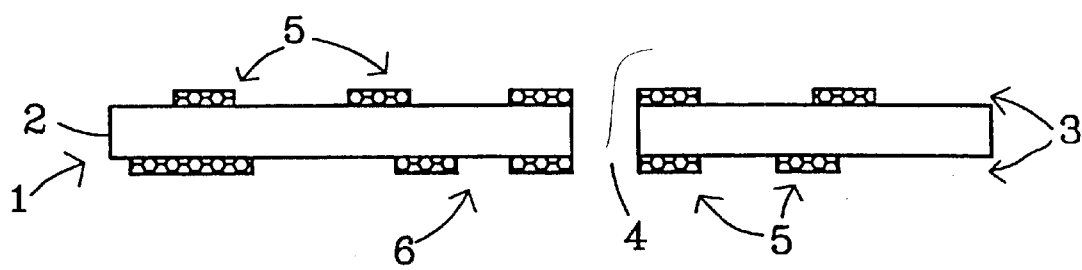
Figure 3:
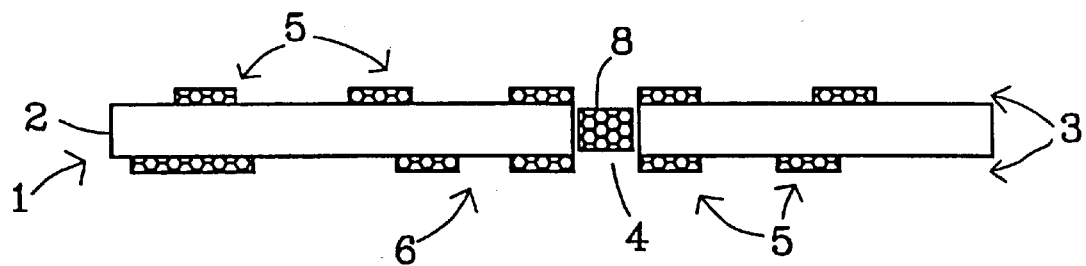
Figure 4:
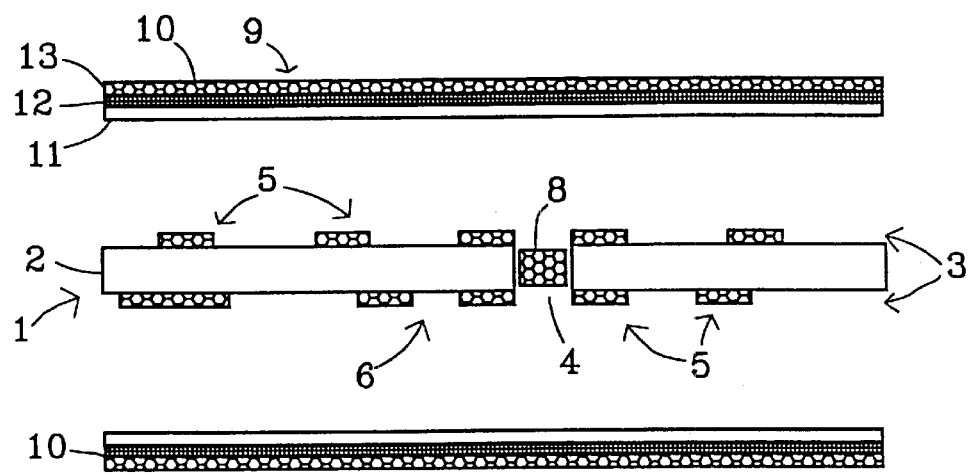
Figure 5:
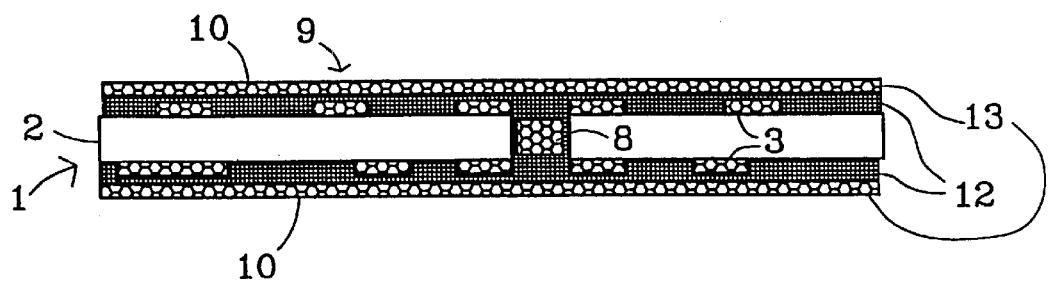
Figure 6:
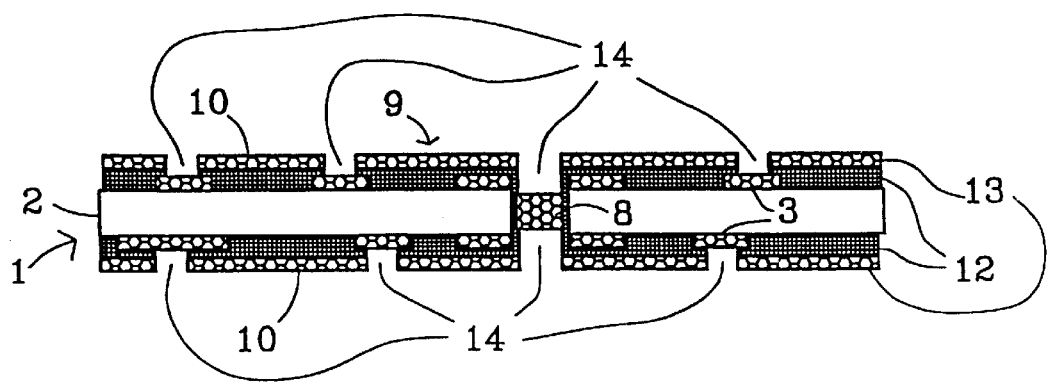
Figure 7:
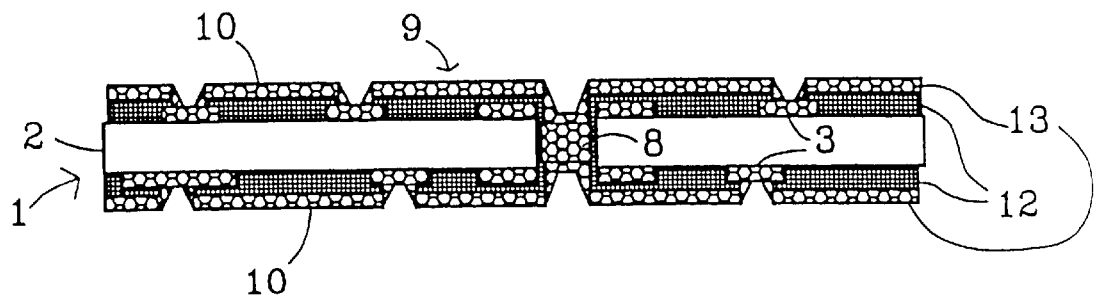
Figure 8:
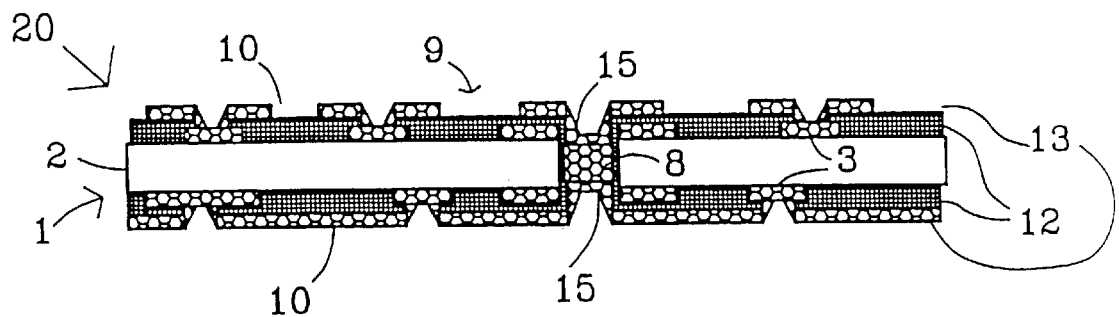

There will now be given a step-by-step description of one embodiment of an inventive method, the method A. The result of certain steps carried out in accordance with the method is shown in FIGS. 1 to 8 inclusive.

Step 1. (FIG. 1) The starting material is a laminate 1, normally a double-sided laminate or a laminate that comprises several layers. The laminate 1 includes a core 2 and one or more metal layers 3. Although the metal layers 3 will most often be placed externally of the laminate, they may also be included within the laminate 1. The laminate 1 is provided with one or more holes 4 which are intended to receive heat sink elements. Normally, small holes—up to six millimetres in size—are drilled, while larger holes are milled. There is no limitation to the shape of the holes.

Step 2. (FIG. 2) One or more patterns 5 are provided on at least one of the metal layers 3 of the laminate 1 in a known manner. Different metal layers 3 will most often have different patterns 5. The metal layers 3 are then etched in accordance with the patterns 5. The underside of the laminate is often used as an earth plane 6.

Step 3. (FIG. 3) A heat sink in the form of a metal stud 8 is placed in the hole 4. The size of the metal stud 8 will normally be adapted to the dimensions of the hole 4.

Step 4a. (FIG. 4) A dielectric 9 is applied to the respective top and bottom surfaces of the laminate 1. In the illustrated case, the dielectric has the form of a foil 10, which may be a so-called RC foil (Resin Coated foil), for instance. The foils 10 are orientated so that their adhesive layers 11 are in contact with the laminate 1 and their conductive layers 13 distal therefrom. An insulator 12 is provided between these two layers 11, 13.

Step 4b. (FIG. 5) The foil 10 is pressed together with the laminate 1, wherewith the adhesive layer 11 disappears as it fastens the insulator 12 to the laminate 1. This compression also causes the insulator 12 to fill the space between the metal stud 8 and the laminate 1, thereby contributing towards affixing the metal stud 8 and also in forming an homogenous join.

Step 5. (FIG. 6) A number of openings 14 are formed in the dielectric 9 all the way down to the metal stud 8 and to one or more of the metal layers 3. The openings 14 that extend down to the metal stud 8 are formed on both the upper and lower side of the laminate 1. The openings 14 can be formed by some photographic method or by cutting holes in the dielectric 9 with the aid of a laser cutter.

Step 6. (FIG. 7) The upper and lower sides of the laminate 1 are clad with metal, so as to obtain electrical contact with the metal layers 3. The cladding metal penetrates down into the openings 14, so as to provide electrical contact with the underlying metal layer 3 and with the metal stud 8.

Step 7. (FIG. 8) When cladding of the laminate is completed, the upper side of the laminate, and possibly also its underside, is/are patterned. The patterned sides are then etched in accordance with said patterns.

The printed circuit board 20 is finished when these steps have been completed. Cooling surfaces 15 with underlying metal studs 8 are now ready to receive their respective components.

Figure 9:
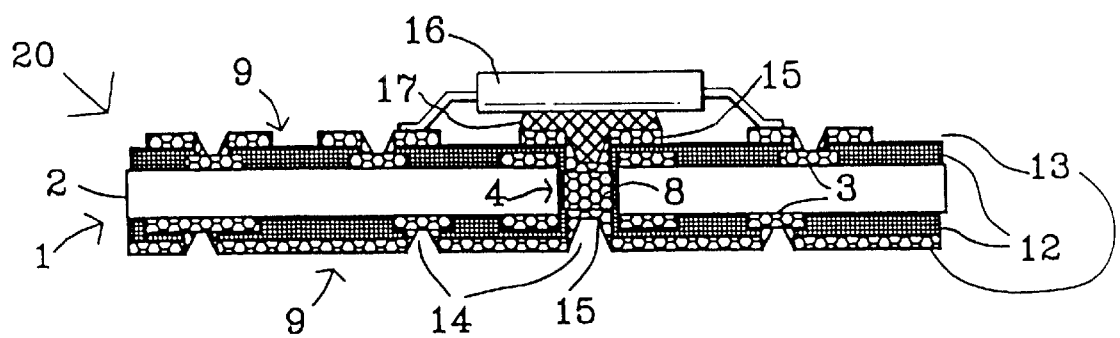
FIG. 9 is a cross-sectional view of a printed circuit board manufactured in accordance with the proposed method and having a component mounted on a heat sink in the form of a metal stud.

FIG. 9 is a cross-section view of the printed circuit board 20 with a mounted component 16. When the printed circuit board 20 is ready, the board is delivered to a component mounting station in which the components 16 is mounted. The component 16, with which cooling is required, is glued or soldered to the cooling surfaces 15 intended to this end, therewith forming a join 17. In this respect, it will be ensured that the transfer of heat from component 16 to the cooling surface 15, via the join 17, will be made as effective as possible, e.g. by appropriate choice of material or by some corresponding means.

An embodiment of the inventive method, method B, will now be described step-by-step. Several of the steps are the same as those undertaken in method A above. The result of the step with which method B differs from method A is shown in FIG. 10.

Steps 1 to 3 inclusive are the same for both method A and method B and therefore require no further description.

Figure 10:
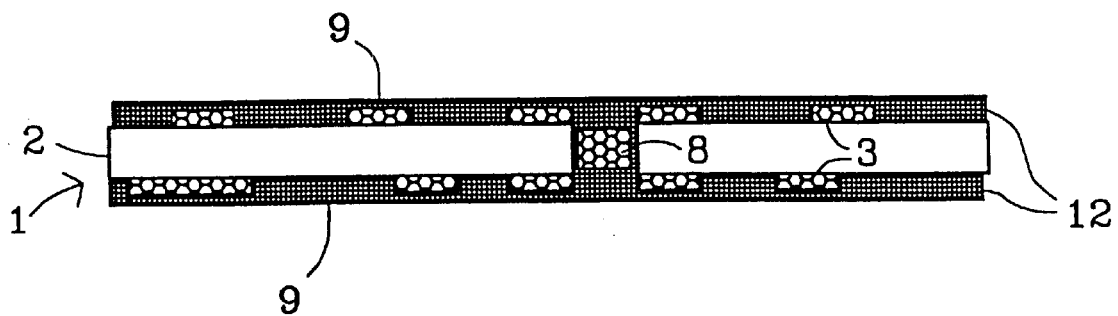
FIG. 10 is a cross-sectional view of a printed circuit board after one step in another embodiment of the inventive method.

Step 4, see FIG. 10, differs from Steps 4a and 4b according to method A. The top and bottom sides of the laminate 1 are varnished with a liquid dielectric 9, which is then dried and hardened to form an insulator 12. Similar to method A, the dielectric 9 fills the space between metal stud 8 and laminate 1 and therewith contributes towards affixing the metal stud 8 and in also in forming an homogenous join.

Steps 5 to 7 inclusive are identical with the same steps in method A.

Figure 11:
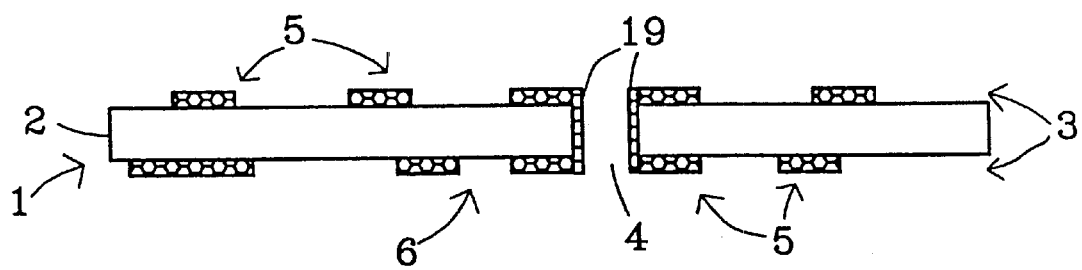
FIGS. 11–13 are cross-sectional views of a printed circuit board after carrying out certain steps in another embodiment of the inventive method.
Figure 12:
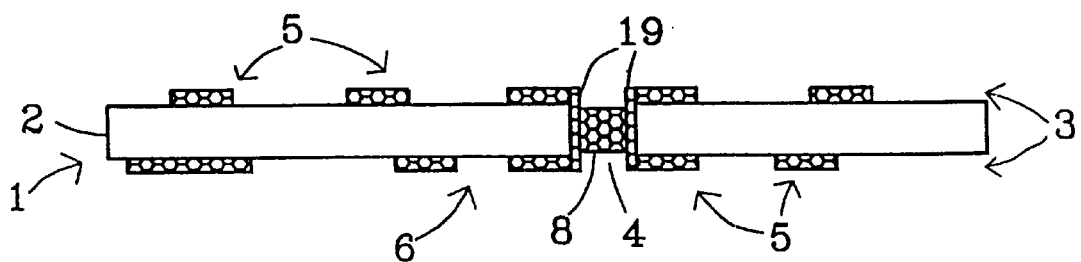
Figure 13:
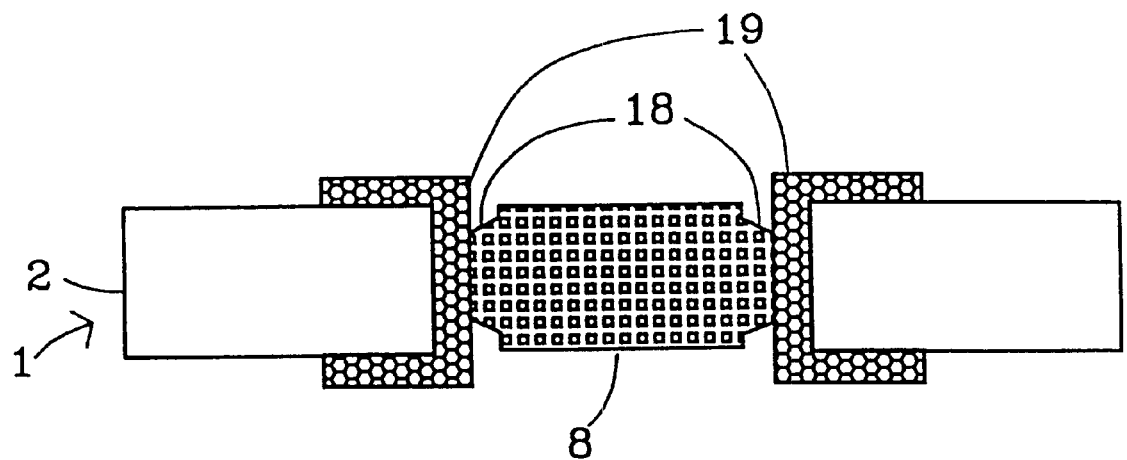

There will now be described a further embodiment of the inventive method, method C. Several of the method steps are the same as those in method A above. The result of those steps where method C differs from method A or method B is shown in FIGS. 11 to 13 inclusive.

Steps 1 and 2 are the same as those in method A and therefore require no further description.

Step 3a. (FIG. 11) The inner surfaces of the hole 4 are metal plated. The metal plating 19 in the hole 4 provides effective electrical contact with any inner layers that may be present in the laminate 1 (not shown in the Figure). This step may precede step 2.

Figure 15:
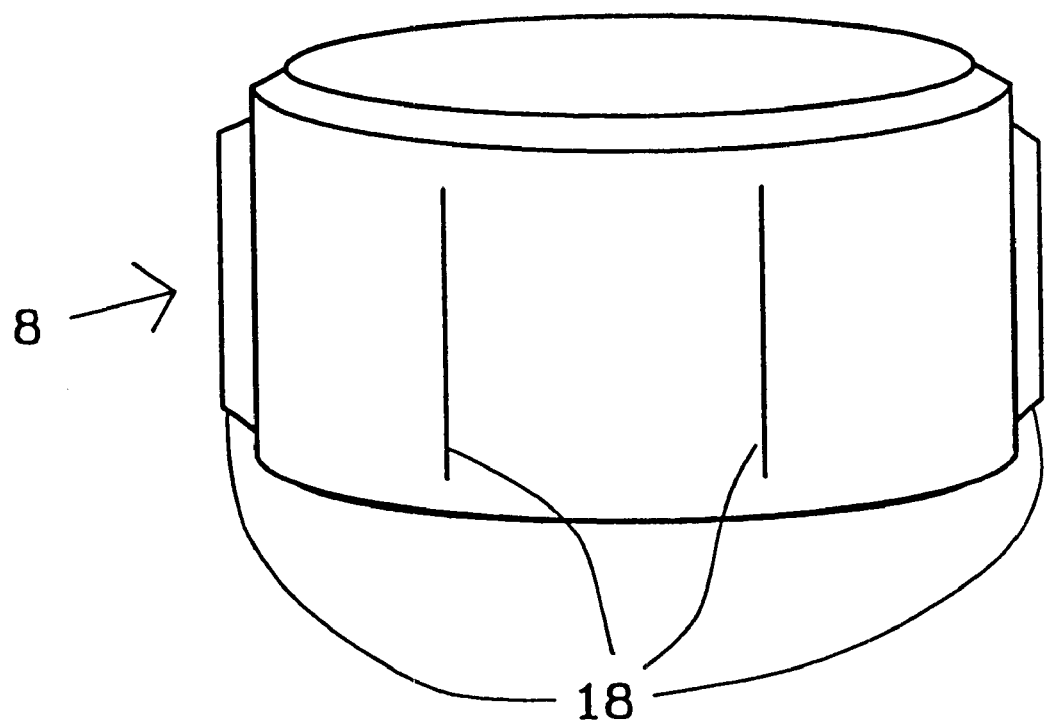
FIG. 15 illustrates a metal stud which is different to the stud shown in FIG. 14 and which can be used in the method according to FIGS. 11–13.

Step 3b (FIG. 12) A metal stud 8 is pressed-fitted in the hole 4. The dimensions of the metal stud 8 will normally be adapted to the dimensions of the hole 4. The metal stud 8 is also designed so that it will fasten in the metal plating 19 in some way or the other when pressed thereinto. For instance, the metal stud 8 may be provided with a cutting edge 18 which bites into the metal plating 19 in the hole 4, thereby enabling a gastight seal to be formed. Such an arrangement is shown in FIG. 13 and FIG. 15.

Step 4 in method C may either follow steps 4a and 4b in method A or follow step 4 in method B.

Steps 5 to 7 inclusive are identical with these steps in method A.

Figure 14:
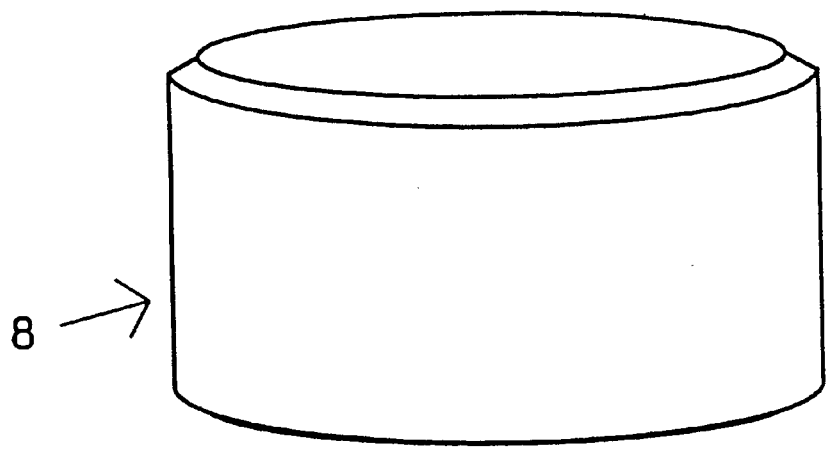
FIG. 14 illustrates a metal stud that can be used in the methods according to FIGS. 1–8 and FIG. 10 respectively.

FIG. 14 illustrates a type of metal stud 8 that can be used in methods A and B. The edges of the stud 8 will preferably be bevelled.

FIG. 15 illustrates a heat sink element, according to the invention in the form of a metal stud 8 which can be used in method C. An essential difference with the metal stud 8 shown in FIG. 14 is that the stud is provided with a cutting edge 18 to enable effective electrical contact to be achieved when the stud is pressed into place.

These methods are able to result in direct metallic contact between components 16 and metal stud 8. When necessary, the metal studs 8 on the opposite side of the circuit board 20 may be mounted on an outer cooling surface and therewith enhance the heat sink capacity. This provides rapid, local heat conduction which enables component 16 to be placed on the surface of the circuit board 20 without needing to pay particular attention to the heat losses of the component 16. Furthermore, a highly effective earth contact is obtained between the underside of respective component 16 and the earth plane 6. In method C, earth planes in the inner layer of the laminate 1 will be connected electrically to the metal stud 8. This is achieved at low cost and without requiring new processes in printed circuit board technology.

The order in which certain steps are carried out in the aforedescribed methods may be switched, without changing the result to any great extent. For instance, step 1, in which the holes 4 are formed in the laminate 1, may be placed after step 2, the transfer and etching of patterns 5. Other minor variations in the order in which the steps are carried out are also conceivable.

It will be understood that the invention is not limited to the aforedescribed and illustrated exemplifying embodiments thereof, and that modifications can be made within the scope of the accompanying claims.

What is claimed is:

1. An arrangement which enables heat to be conducted rapidly and locally away from a component mounted on a printed circuit board, said arrangement comprising:

a heat sink element fastened in a hole in the circuit board; and a metal plating on a) at least the upper side of the heat sink element and b) the upper part of the inside of the hole and also c) immediate surroundings of the hole on the upper side of the circuit board.

2. An arrangement according to claim 1, wherein the heat sink element includes cutting edges which bite into the metal plating in the hole, therewith providing a seal.

3. An arrangement according to claim 1, wherein said metal plating further formed on a lower side of the heat sink element, a lower part of the inside of the hole and immediate surroundings of the hole on a lower side of the circuit board.

4. An arrangement according to claim 1, wherein said heat sink element partially fills the hole.

5. An arrangement which enables heat to be conducted rapidly and locally away from a component mounted on a printed circuit board, said arrangement comprising:

a heat sink element fastened in a hole in the circuit board; and a metal plating provided on an upper side of the heat sink element, an upper part of an inside of the hole, and immediate surroundings of the hole on an upper side of the circuit board.

6. An arrangement according to claim 5, wherein the heat sink element includes cutting edges which bite into the metal plating in the hole, therewith providing a seal.

7. An arrangement according to claim 5, wherein said metal plating further formed on a lower side of the heat sink element, a lower part of the inside of the hole and immediate surroundings of the hole on a lower side of the circuit board.

8. An arrangement according to claim 5, wherein said heat sink element partially fills the hole.

9. An arrangement which enables heat to be conducted rapidly and locally away from a component mounted on a printed circuit board, said arrangement comprising:

a heat sink element fastened in a hole in the circuit board; and a metal plating integrally formed on at least an upper side of the heat sink element, an upper part of an inside of the hole, and immediate surroundings of the hole on an upper side of the circuit board.

10. An arrangement according to claim 9, wherein the heat sink element includes cutting edges which bite into the metal plating in the hole, therewith providing a seal.

11. An arrangement according to claim 9, wherein said metal plating further formed on a lower side of the heat sink element, a lower part of the inside of the hole and immediate surroundings of the hole on a lower side of the circuit board.

12. An arrangement according to claim 9, wherein said heat sink element partially fills the hole.

* * * * *